US012142905B2

(12) United States Patent
Ratfisch et al.

(10) Patent No.: US 12,142,905 B2
(45) Date of Patent: Nov. 12, 2024

(54) BUSBAR AND ARRANGEMENT COMPRISING SUCH A BUSBAR

(71) Applicant: Carl Freudenberg KG, Weinheim (DE)

(72) Inventors: Rouven Ratfisch, Gernsheim (DE); Ralf Heldmann, Wald-Michelbach (DE); Guenter Ziegler, Mannheim (DE); Markus Clemens, Reichelsheim (DE); Juergen Mall, Duesseldorf (DE)

(73) Assignee: CARL FREUDENBERG KG, Weinheim (DE)

( * ) Notice: Subject to any disclaimer, the term of this patent is extended or adjusted under 35 U.S.C. 154(b) by 367 days.

(21) Appl. No.: 17/679,130

(22) Filed: Feb. 24, 2022

(65) Prior Publication Data

US 2022/0278518 A1     Sep. 1, 2022

(30) Foreign Application Priority Data

Feb. 26, 2021   (DE) .................. 10 2021 104 624.6

(51) Int. Cl.
*H02G 5/06*     (2006.01)
*H02G 5/00*     (2006.01)

(52) U.S. Cl.
CPC .............. *H02G 5/06* (2013.01); *H02G 5/002* (2013.01)

(58) Field of Classification Search
CPC ...... B60R 16/0239; H02G 5/002; H02G 5/06; H01R 13/521
USPC ...................................................... 439/587
See application file for complete search history.

(56) References Cited

U.S. PATENT DOCUMENTS

| 3,599,170 | A   | * | 8/1971  | Kurisu ............... H01R 13/53 |
|           |     |   |         | 439/272 |
| 6,376,772 | B1  | * | 4/2002  | Pioch ................ H01B 17/303 |
|           |     |   |         | 174/152 G |
| 8,727,356 | B2  | * | 5/2014  | Lutaud ............... F16J 15/3204 |
|           |     |   |         | 277/553 |
| 2002/0023769 | A1 |  | 2/2002  | Pioch |
| 2009/0004918 | A1 | * | 1/2009 | Papanide ............. H03H 7/38 |
|           |     |   |         | 333/32 |
| 2011/0186350 | A1 |  | 8/2011 | Guntermann et al. |
| 2014/0242838 | A1 | * | 8/2014 | Ikezawa .............. H01R 13/405 |
|           |     |   |         | 439/587 |
| 2016/0134049 | A1 | * | 5/2016 | Kataoka ............. H01R 13/6581 |
|           |     |   |         | 439/587 |
| 2019/0305460 | A1 | * | 10/2019 | Kawamura ........ H01R 13/5202 |

(Continued)

FOREIGN PATENT DOCUMENTS

| DE | 102007034478 A1 | 1/2009 |
| DE | 102010043773 A1 | 8/2011 |
| DE | 102015213439 A1 | 1/2017 |

(Continued)

*Primary Examiner* — Marcus E Harcum
(74) *Attorney, Agent, or Firm* — LEYDIG, VOIT & MAYER, LTD.

(57) ABSTRACT

Busbar comprising a supporting body (1) made of a tough-hard material, and at least one electrical conductor (2.1, 2.2, 2.3, . . . ), wherein the conductor (2.1, 2.2, 2.3, . . . ) is connected to the supporting body (1). The supporting body (1) comprises a seal (3) that is made of a rubber-elastic material, which encloses the conductor (2.1, 2.2, 2.3, . . . ) on the outer circumferential side with an annular sealing region (4) in a sealing manner.

17 Claims, 3 Drawing Sheets

(56) References Cited

U.S. PATENT DOCUMENTS

2020/0122657 A1* 4/2020 Goto .................. H01R 9/18

FOREIGN PATENT DOCUMENTS

| DE | 102017113992 A1 | 2/2018 |
| DE | 102018109863 A1 | 10/2019 |
| EP | 0944101 A1 | 9/1999 |

* cited by examiner

Cross-Section X

BUSBAR AND ARRANGEMENT COMPRISING SUCH A BUSBAR

CROSS REFERENCE TO RELATED APPLICATIONS

This application claims benefit to German Patent Application No. DE 10 2021 104 624.6, filed on Feb. 26, 2021, which is hereby incorporated by reference herein.

FIELD

The invention relates to a busbar comprising a supporting body made of a tough-hard material and at least one electrical conductor, wherein the conductor is connected to the supporting body.

BACKGROUND

Busbars are generally known and used, for example, in the field of "e-mobility". Busbars are already prior art in various designs.

However, it should be noted that the previously known busbars are used only in the case of "dry" interfaces of the power transfer.

In the previously known busbars, the conductor is embedded directly in a supporting body consisting of a tough-hard plastic. The conductor is directly enclosed by the plastic of the supporting body.

However, it is disadvantageous here that the transition from the conductor to the supporting body is not permanently tight.

This is primarily due to the fact that the supporting body, which consists of a tough-hard plastic material, and the conductors have different coefficients of thermal expansion, as a result of which, in the case of temperature changes, they expand or contract to different extents, and therefore undesirable leaks frequently occur in the transition region between the supporting body and the conductor.

If the interface of the power transfer, as described above, is dry, such a disadvantage is less serious.

However, if the previously known busbar is used in an environment with a liquid medium, such leaks are not acceptable. In such a case, the leaks cause undesired leakage between the supporting body and the conductor.

Summary In an embodiment, the present disclosure provides a busbar comprising a supporting body made of a tough-hard material and at least one electrical conductor connected to the supporting body, wherein the supporting body comprises a seal made of a rubber-elastic material, the seal having an outer circumferential side with an annular sealing region and being configured to enclose the conductor in a sealing manner on the outer circumferential side.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
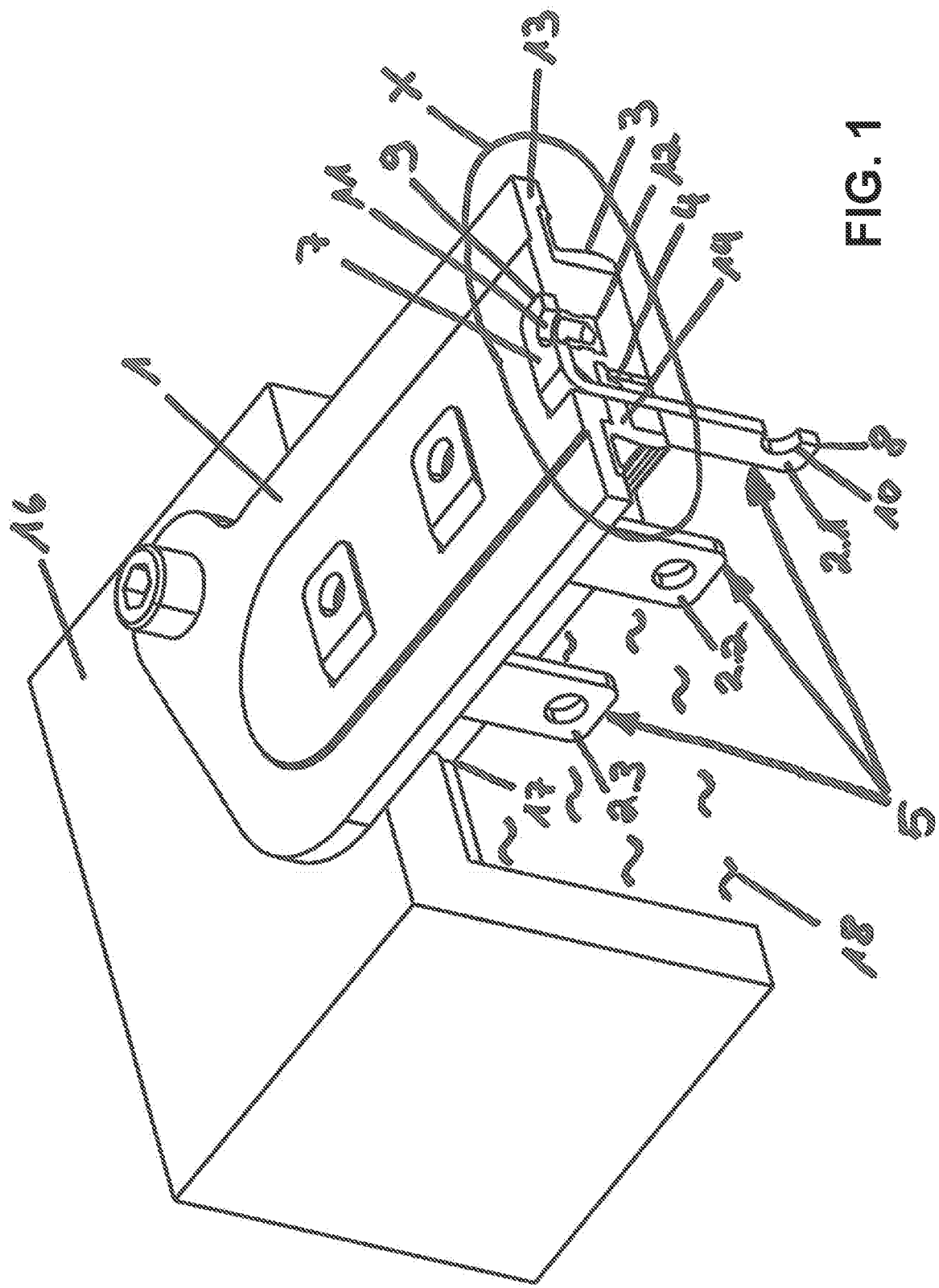
FIG. 1 shows a perspective section through a busbar.

Embodiments of the present invention further develop a busbar and an arrangement of the type mentioned at the beginning in such a manner that the busbar can also be used in an environment with a liquid medium and/or be exposed to temperature changes and nevertheless have good usage properties during a long service life. In particular, the transition region between the supporting body and the conductor should also be permanently tight.

Claims making direct or indirect reference to the aforementioned claims refer to advantageous embodiments.

In some embodiments, a busbar is provided, as described above, wherein the supporting body comprises a seal made of a rubber-elastic material which sealingly encloses the conductor on the outer circumference with an annular sealing region.

Due to the permanently elastic properties of the rubber-elastic material of the seal, the transition region between the supporting body and the conductor is always tight, independent of temperature changes and irrespective of whether the busbar is subjected to gaseous or liquid media. The different coefficients of thermal expansion of supporting body and conductor that differ from one another do no longer play any role even in the above-described environmental conditions of the busbar. Different coefficients of thermal expansion are always functionally compensated by the seal. The risk of leakage in the transition region between the supporting body and the conductor is due to the merely indirect connection between the two, namely the connection by means of the seal made of a rubber-elastic material.

The previously described busbar is particularly well suited for use in the field of "e-mobility". In such a case, the busbar is used in a cooled environment and is subjected to a special hydrocarbon coolant which is electrically non-conductive.

The supporting body may comprise a polymeric material. It is advantageous here that such supporting bodies having complicated geometries can also be produced easily and cost-effectively. In addition, it is advantageous that the supporting body is electrically non-conductive and can therefore be used particularly well in the field of e-mobility.

The seal may consist of an elastomeric material. Elastomers for seals are available in a large number of specifications that differ from one another. The adaptation to the respective conditions of the application is thus particularly easy. Many elastomeric sealing materials are also available cost-effectively.

The supporting body and the seal may be joined together by a substance-to-substance bond. Such a substance-to-substance bond can be produced in that the conductor positioned in the supporting body is overmolded with an elastomeric material of the seal in order to achieve a permanently sealing connection in the transition region between the supporting body and the conductor.

Deviating from this, it is generally also possible to provide, for example, a non-positive and/or positive connection. However, keeping such a connection permanently tight would not be without problems. A large number of parameters would have to be taken into account, for example the elastic pressing of the seal between the supporting body and the conductor.

The conductor can be formed as a copper-metal part. Such a part has good electrical conductivity.

The conductor can be formed as a plug. Depending on the application in which the busbar is used, a plurality of conductors can be connected to a common supporting body. For example, three conductors per supporting body can be used.

The conductor can be substantially L-shaped in cross section and have a first and a second leg. Such L-shaped conductors are simple and cost-effective to produce and easy to arrange in a supporting body.

Each of the legs of the conductor can have a contact on the free ends facing away from one another. Such a contact can be formed, for example, by a breach. For example, plugs of other electrical lines can be inserted into the breach or other electrical contacts can be made in the breaches with the respective leg.

The conductor can penetrate the supporting body with one of its legs. In such a case, the one leg penetrates the supporting body and the other leg lies, preferably flush, on the surface of the supporting body. As a result, the positioning of the leg penetrating the supporting body is possible particularly precisely and easily.

In the case of the ready-to-use busbar, for example, all the legs of all the conductors to be used protrude the same distance from the supporting body.

The supporting body can comprise a core and a collar-shaped fastening flange, wherein the core is surrounded on the outer circumference by the fastening flange. By means of such an embodiment, the busbar can be easily fastened to a machine element, for example to a housing, by means of the fastening flange. The busbar is fastened by means of the fastening flange, for example, over the opening of a housing and closes the opening in a sealing manner. The core has a greater thickness than the fastening flange. In such a case, the leg of the conductor is arranged in the core, wherein one of the legs penetrates the core.

Fastening/centering means can be provided in the fastening flange in order to fasten and/or center the busbar on the housing.

In addition to the sealing region, which encloses the conductor in an outer circumferential and annular sealing manner, the seal can comprise a flange region which, viewed in cross-section, is L-shaped and merges from the fastening flange into the outer circumference of the core and encloses the core in a closed sealing manner. The flange region of the seal seals, for example, the previously described opening of the housing against the surroundings of the housing. A medium located within the housing is thereby held within the housing and prevented from escaping into the environment in an undesired manner.

The sealing region and the flange region may be formed in such a manner as to merge into one another in one piece and are composed of a single material. It is advantageous here that the sealing region and the flange region are connected together with the supporting body in one operation. As a result, the production of the busbar is simple and cost-effective.

In addition, the invention relates to an arrangement comprising a busbar, as described above, and a housing having an opening which is sealingly closed by the busbar, wherein a medium to be sealed is arranged in the housing.

The medium to be sealed can be formed by a liquid medium, in particular a coolant. Such a coolant is formed, for example, by a special hydrocarbon coolant which is used in the field of "e-mobility".

BRIEF DESCRIPTION OF THE DRAWINGS

An exemplary embodiment of the busbar in accordance with the invention and the arrangement in accordance with the invention, in which the busbar in accordance with the invention is used, will be described in more detail below with reference to FIGS. 1 to 3. The following is shown in schematic form:

An exemplary embodiment of the busbar according to the invention is shown in FIG. 1. The busbar comprises the supporting body 1 made of a polymeric, tough-hard material and three electrical conductors 2.1, 2.1, 2.3 which are arranged in the supporting body 1.

In the exemplary embodiment shown, the conductors 2.1, 2.2, 2.3 each consist of a copper-metal part, wherein the conductors 2.1, 2.2, 2.3 are each formed as a plug 5.

The power transfer takes place by means of the conductors 2.1, 2.2., 2.3. The conductors 2.1, 2.2, 2.3 are, as shown here, substantially L-shaped and each have a first leg 6 and a second leg 7, which are assigned substantially at right angles to one another. The free ends 8, 9 of the legs 6, 7 each have a contact 10, 11, to which further electrical conductors can be connected to supply or discharge the power.

Figure 2:
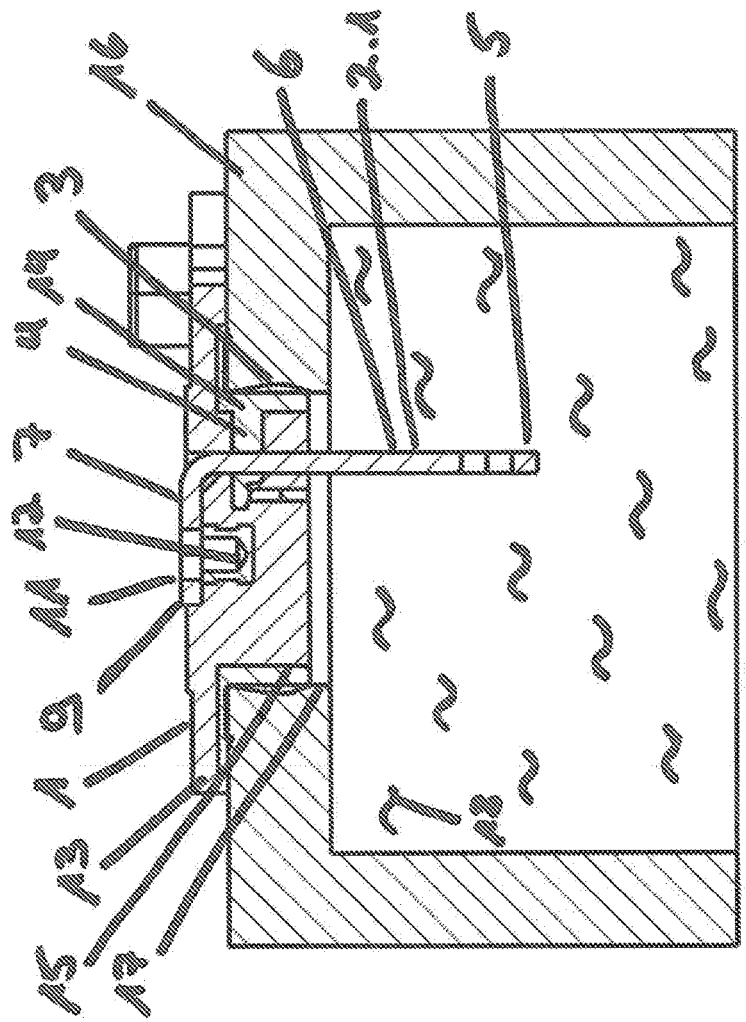
FIG. 2 shows an enlarged cross-section x from FIG. 1.

In FIGS. 1 and 2, a housing 16 with an opening 17 is also schematically indicated, wherein the opening 17 is sealingly closed by the busbar according to the invention. A liquid medium 18 to be sealed is located within the housing 16. The first legs 6 of the busbar can be acted upon by this medium 18.

In order to achieve a good sealing of the housing 16 and, in particular, a good sealing between the supporting body 1 and the conductors 2.1, 2.2, 2.3, the seal 3 of rubber-elastic material is arranged between the supporting body 1 and the conductors 2.1, 2.2, 2.3, which sealingly encloses the conductors 2.1, 2.2, 2.3 on the outer circumferential side with an annular sealing region 4. The sealing region 4 has the effect that, in the transition region between the supporting body 1 and the conductors 2.1, 2.2., 2.3, no medium 18 to be sealed can escape from the interior of the housing 16 past the conductors 2.1, 2.2, 2.3 into the surroundings of the busbar.

The annular sealing region 4 is formed integrally and materially with the flange region 14, which is also encompassed by the seal 3. The flange region 14 is formed L-shaped in cross section.

As a result, it is adapted to the shape of the supporting body 1 with the core 12 and the fastening flange 13.

The supporting body 1 comprises the core 12, which is surrounded on the outer circumference by the collar-shaped fastening flange 13. The shape of the flange region 14 results from the fact that the flange region 14 extends on the outer circumference in a closed and sealing manner around the core 12. One of the legs of the flange region 14 seals the perimeter of the opening 17 on the housing 16, while the other leg seals the surfaces of the housing 16 and fastening flange 13 that are facing one another.

Figure 3:
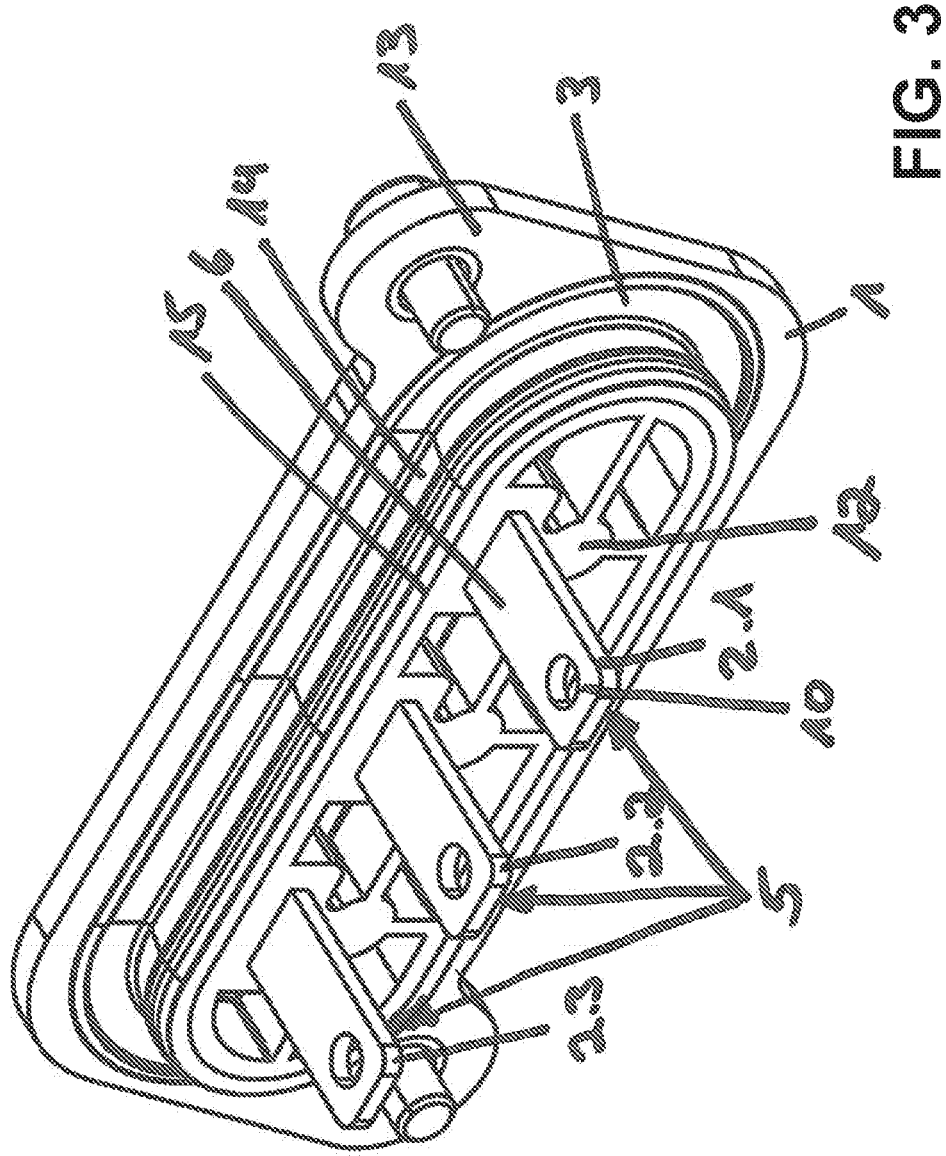
FIG. 3 shows a perspective view of the busbar from FIG. 1 from below, from the direction of a housing to be sealed.

FIG. 3 shows the busbar as an individual part in a perspective view from below. The conductors 2.1, 2.2, 2.3 penetrate the core 12 of the supporting body 1 with their legs 6, wherein the legs 6 are sealed relative to the core 12 by the sealing region 4 which is not visible here. The flange region 14 of the seal 3 encloses the core 12 on the outer circumferential side in a closed and sealing manner.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A busbar comprising:
   a supporting body with a core having an outer circumference surrounded by a collar-shaped fastening flange, the core having a greater thickness than the fastening flange, the supporting body made of a tough-hard material; and
   at least one electrical conductor connected to the supporting body, the conductor having an outer perimeter,
   wherein the supporting body comprises a seal made of a rubber-elastic material and configured to enclose the outer perimeter of the conductor in a sealing manner, and
   wherein the seal further comprises a flange region having an 'L' shaped cross-section, a first portion of the flange region abutting the fastening flange and a second portion of the flange region enclosing the circumference of the core in a sealing manner.

2. The busbar according to claim 1, wherein the supporting body is comprised of a polymeric material.

3. The busbar according to claim 1, wherein the seal is comprised of an elastomeric material.

4. The busbar according to claim 1, wherein the supporting body and the seal are connected to one another with a substance-to-substance bond.

5. The busbar according to claim 1, wherein the conductor comprises a copper-metal part.

6. The busbar according to claim 1, wherein the conductor is configured as a plug.

7. The busbar according to claim 1, wherein the conductor comprises a first leg and a second leg.

8. The busbar according to claim 7, wherein the first leg and the second leg each have a contact at a free end, the free ends of each of the first leg and the second leg facing away from one another respectively.

9. The busbar according to claim 7, wherein the conductor penetrates the supporting body with one of the first leg and the second leg.

10. The busbar according to claim 7, wherein the core is penetrated by one of the first leg and the second leg.

11. The busbar according to claim 1, wherein the configuration of the seal to enclose the outer perimeter of the conductor of the seal and the flange region of the seal merge integrally and comprise the same material.

12. The busbar according to claim 1, wherein the 'L' shaped cross-section of the flange region is formed by the first portion and the second portion.

13. The busbar according to claim 12, wherein the 'L' shaped cross-section of the flange region is formed by the seal leg and the another seal leg.

14. A busbar arrangement according to claim 12, wherein the flange region further comprises a plurality of annular rings projecting from the second portion, the projection of the annular rings being toward the opening and configured to seal the housing and the supporting body.

15. The busbar according to claim 1, wherein the first portion of the flange region comprises a seal leg abutting the fastening flange along a length of the seal leg and the second portion of the flange region comprises another seal leg enclosing the circumference of the core along a length of the another seal leg.

16. A busbar arrangement according to claim 15, wherein the projection of the annular rings are configured to seal the housing and the supporting body against the egress of the liquid medium from the housing.

17. A busbar arrangement comprising:
    a housing containing a liquid medium and having a top side defining an opening;
    a busbar comprised of a supporting body with a core having an outer circumference surrounded by a collar-shaped fastening flange, the core having a greater thickness than the fastening flange and configured to project into the opening such that the fastening flange abuts the top side of the housing, the supporting body being made of a tough-hard material, and an at least one electrical conductor connected to the supporting body, the conductor having an outer perimeter; and
    a seal made of a rubber-elastic material and configured to enclose the outer perimeter of the conductor in a sealing manner,
    wherein the seal further comprises a flange region having an 'L' shaped cross-section, a first portion of the flange region being disposed between the fastening flange and the top side of the housing and a second portion of the flange region being disposed between the circumferential side of the core and the opening of the housing, the flange region configured to seal the housing against the surroundings of the housing such that the liquid medium of the housing will not leak to a surrounding area.

* * * * *